(12) United States Patent
Dejneka et al.

(10) Patent No.: US 10,299,396 B2
(45) Date of Patent: May 21, 2019

(54) METHODS AND APPARATUS FOR PROVIDING IMPROVED VISUAL AND OPTIONALLY TACTILE FEATURES ON A SUBSTRATE

(71) Applicant: CORNING INCORPORATED, Corning, NY (US)

(72) Inventors: Matthew John Dejneka, Corning, NY (US); Matthew Wade Fenton, Elmira, NY (US); Yuhui Jin, Painted Post, NY (US); Timothy James Kiczenski, Corning, NY (US)

(73) Assignee: Corning Incorporated, Corning, NY (US)

( * ) Notice: Subject to any disclaimer, the term of this patent is extended or adjusted under 35 U.S.C. 154(b) by 86 days.

(21) Appl. No.: 15/678,817

(22) Filed: Aug. 16, 2017

(65) Prior Publication Data
US 2018/0054904 A1 Feb. 22, 2018

Related U.S. Application Data

(60) Provisional application No. 62/397,657, filed on Sep. 21, 2016, provisional application No. 62/375,642, filed on Aug. 16, 2016.

(51) Int. Cl.
| | |
|---|---|
| *B32B 3/00* | (2006.01) |
| *H05K 5/02* | (2006.01) |
| *H05K 5/00* | (2006.01) |
| *H05K 5/03* | (2006.01) |
| *H04M 1/02* | (2006.01) |
| *G06F 1/16* | (2006.01) |

(52) U.S. Cl.
CPC ........ *H05K 5/0217* (2013.01); *H04M 1/0283* (2013.01); *H05K 5/0017* (2013.01); *H05K 5/03* (2013.01); *G06F 1/1637* (2013.01)

(58) Field of Classification Search
CPC ....... H05K 5/0217; H05K 5/03; H05K 5/0017
See application file for complete search history.

(56) References Cited

U.S. PATENT DOCUMENTS

| | | |
|---|---|---|
| 4,463,045 A | 7/1984 | Ahr et al. |
| 6,479,142 B1 | 11/2002 | Condon et al. |
| 7,736,750 B2 | 6/2010 | Medwick et al. |
| 7,875,338 B2 | 1/2011 | Souparis |
| 8,729,593 B2 | 5/2014 | Nakamura et al. |

(Continued)

FOREIGN PATENT DOCUMENTS

| | | |
|---|---|---|
| JP | 5615567 B2 | 10/2014 |
| WO | 2011133013 A1 | 10/2011 |
| WO | 2016118462 A2 | 7/2016 |

OTHER PUBLICATIONS

International Searching Authority Invitation to Pay Additional Fees and Partial Search Report PCT/US2017/046247 dated Nov. 17, 2017.

(Continued)

*Primary Examiner* — Elizabeth E Mulvaney
(74) *Attorney, Agent, or Firm* — Jeffrey A. Schmidt

(57) ABSTRACT

Methods and apparatus provide for an improved visual and optionally tactile features on a visible element of an article, such as a consumer electronic device (e.g., a mobile electronic device, a mobile phone, a smartphone, a tablet, a phablet, a notebook computer, a laptop, etc.).

21 Claims, 10 Drawing Sheets

(56) References Cited

U.S. PATENT DOCUMENTS

| | | | |
|---|---|---|---|
| 9,090,047 B2 | 7/2015 | Neely | |
| 9,198,335 B2 * | 11/2015 | Chang | H05K 5/0217 |
| 9,291,827 B2 | 3/2016 | Lee et al. | |
| 9,751,297 B1 * | 9/2017 | Sheu | B41J 2/01 |
| 2003/0037569 A1 | 2/2003 | Arbab et al. | |
| 2012/0229306 A1 | 9/2012 | Lin | |
| 2013/0280463 A1 * | 10/2013 | On | B32B 3/10 |
| | | | 428/38 |
| 2015/0146280 A1 | 5/2015 | Degott et al. | |
| 2016/0016845 A1 | 1/2016 | Cho et al. | |
| 2017/0205541 A1 | 7/2017 | Amin et al. | |
| 2017/0347476 A1 * | 11/2017 | Hwang | C23C 16/44 |

OTHER PUBLICATIONS

Borrelli et al. Pending U.S. Appl. No. 15/619,942, filed Jun. 12, 2017. "Multicolored Photosensitive Glass-Based Parts and Methods of Manufacture".

Hall et al. U.S. Appl. No. 62/422,300, filed Nov. 15, 2016. "Processes of Making Glass With Textured Surface and 3-D Shape".

* cited by examiner

100-1

256

258

260

100-2

100-2

100-2

100-2

100-4

100-4

100-4

100-4

METHODS AND APPARATUS FOR PROVIDING IMPROVED VISUAL AND OPTIONALLY TACTILE FEATURES ON A SUBSTRATE

CROSS-REFERENCE TO RELATED APPLICATIONS

This application claims the benefit of priority under 35 U.S.C. § 119 of U.S. Provisional Application Ser. No. 62/397,657 filed on Sep. 21, 2016, which in turn, claims the benefit of priority of U.S. Provisional Application Ser. No. 62/375,642 filed on Aug. 16, 2016, the contents of each of which are relied upon and incorporated herein by reference in their entireties.

BACKGROUND

The present disclosure relates to methods and apparatus for providing improved visual and optionally tactile features on a substrate, such as on a substrate used on a consumer article.

As the sophistication of consumers continues to evolve and increase, the importance of aesthetic features, especially the integration of form and function, also increases. Nowhere is this more evident than in the field of consumer electronics, such as in the design of mobile electronic devices (such as, mobile phones, smartphones, tablets, phablets, notebook computers, laptops, etc.). There have been many instances in which a consumer electronic device that exhibits some enhanced aesthetic feature over competing devices will enjoy significantly higher acceptance in the marketplace despite relatively comparable functional characteristics.

For example, there have been efforts in the marketplace to add a visual element, such as an image or color feature, to some surface(s) of a mobile electronic device, such as to the back side of a mobile phone. While consumers have come to accept and even desire such visual elements, a consistent issue with previous efforts is the relatively flat two-dimensional and/or passive appearance of the visual element.

Accordingly, there are needs in the art for new methods and apparatus for providing visual and optionally tactile features on a substrate.

SUMMARY

The present disclosure relates to methods and apparatus for providing improved visual and optionally tactile features on a visible element of an article, such as a consumer electronic device (e.g., a mobile electronic device, a mobile phone, a smartphone, a tablet, a phablet, a notebook computer, a laptop, etc.)

In accordance with one or more embodiments, an article may include some form of a housing in which functional elements of the article are disposed. For example, the housings of many smartphone devices include a touchscreen on a front side of the article and a substrate on the back side of the article. In rather basic configurations, the substrate on the back side of the article may be opaque, such as black or white. More interesting visual elements may include color, color and/or patterns, designs, images, etc. In robust applications, such visual elements (especially printed elements) may be disposed on an inner surface (e.g., an inwardly facing surface of the substrate or, in other words, a surface facing the interior of the housing) of an at least partially transparent, at least partially transmissive, or at least partially translucent substrate, such as a glass substrate, a glass-ceramic substrate, or a polymer substrate. Partially transparent, partially transmissive, and/or partially translucent may be quantified, for example, by exhibiting greater than about 1% (and preferably greater than about 5%) direct transmission of light. Thus, the visual element may be seen by the user through the substrate but the visual element is protected from wear or damage by way of being disposed on the inwardly facing surface of the substrate.

In accordance with one or more further embodiments, the above-noted visual element(s) may be combined with one or more tactile elements. For example, an outer surface of the substrate (e.g., an outwardly facing surface of the housing) on the back side of the article may be subject to surface processing in order to provide some level of roughening (e.g., a surface roughening, a hazing effect, etc.) and/or some relatively small surface elements exhibiting height difference characteristics in order to provide some tactile feedback to the user. The tactile feedback may range from a feeling of sticky smooth (very little or no surface roughness and/or small surface elements), to a feeling of velvety softness (moderate levels of surface roughness and/or small surface elements), to a feeling of substantial roughness (higher levels of surface roughness and/or small surface elements). The surface roughness discussed herein may be quantified, for example, as exhibiting an Ra surface roughness of between about 10 nm and about 80 nm for a relatively sticky-smooth surface roughness, between about 80 nm and about 300 nm for a relatively moderate surface roughness, and greater than about 300 nm for a relatively rough surface roughness. The height difference characteristics of the small surface elements discussed herein may be implemented via relatively small elements extending away from a surface of the substrate and may be quantified, for example, as having a height of between about 10 nm and about 80 nm for a relatively sticky-smooth surface roughness, between about 80 nm and about 300 nm for a relatively moderate surface roughness, and greater than about 300 nm for a relatively rough surface roughness.

In accordance with one or more further embodiments, a combination of the aforementioned visual elements and the aforementioned tactile elements may be combined in such a way as to enhance both the look and the feel of the article. For example, the tactile element may enhance the feel of the article in the user's hand—but the tactile element also may also operate in such a way that the visual effect is visually enhanced as compared to the visual effect without the tactile element. For example, a notably visually stimulating (depth and/or three-dimensional) effect has been discovered by providing the visual element (e.g., an image or pattern) on the inner surface of the substrate and providing the tactile element (e.g., surface roughness and/or small surface elements) in a complimentary way on the outer surface of the substrate. In this regard, the complimentary nature of providing the tactile element may include providing a pattern of roughness and/or small surface elements that complements the color(s), line(s), pattern(s), design(s), and/or image(s), etc. of the visual element. Skilled artisans will appreciate that the aforementioned complementary provision of the tactile element may include providing lines, areas, designs, shapes, patters, etc. of surface roughness and/or small surface elements on the outer surface of the substrate that substantially match (e.g., are in registration with) corresponding lines, shapes, patterns, colors, etc. of the visual element. Notably, however, alternative and desirable visual effects may be obtained without substantial registration, but rather with some alternative complimentary correspondence of, the lines, areas, designs, shapes, patters, etc. of surface roughness and/or small surface elements on the outer surface of the substrate with the visual element on the opposite, inner surface thereof.

In accordance with one or more further embodiments, the aforementioned visual element may be provided in such a way that certain visual characteristics of the visual element change depending on a viewing angle of the user. For example, the visual element may include at least two visual elements, each having at least some differing characteristics (e.g., different colors, different line patterns, different designs, different images, and/or combinations thereof, etc.). The at least two visual elements may be provided in an integrated fashion on or with the substrate in such a way that one of the at least two visual elements is dominant (more visible) than the other (which is subordinate) when the user views the substrate at low viewing angles and the other of the at least two visual elements is dominant (more visible) than the one when the user views the substrate at higher viewing angles (i.e., significantly acute angles). The reference line for measuring viewing angle is a line perpendicular to a major surface of the substrate, and this line is defined as 0 degrees. Viewing angles are then measured with respect to this reference line. By way of example, a low viewing angle is one that is in the same direction (or parallel) with the reference line, and ones less than the significantly acute angle. By way of example, a significantly acute angle may be greater than about 10 degrees, 20 degrees, 30 degrees, 40 degrees, 50 degrees, 60 degrees, 70 degrees, or 80 degrees, all as measured with respect to the reference line. A transitional effect, where the user may see a gradual change from dominance to subordinance of the one visual characteristic to the other visual characteristic as the viewing angle changes from low to high (significantly acute), and vice versa. The angle (or range of angles) at which transition between low viewing angle and high viewing angle takes place may vary depending upon the desired effect for a particular embodiment.

In accordance with one or more further embodiments, the above-noted effect of gradual variation from dominance to subordinance of a visual element as a function of viewing angle may be combined with the above-noted complementary tactile features (surface roughness, haze, and/or small surface elements) to produce even more visual and tactile effects.

The embodiments, and the features of those embodiments, as discussed herein are exemplary and can be provided alone or in any combination with any one or more features of other embodiments provided herein without departing from the scope of the disclosure.

Other aspects, features, and advantages will be apparent to one skilled in the art from the description herein taken in conjunction with the accompanying drawings.

DESCRIPTION OF THE DRAWINGS

For the purposes of illustration, there are forms shown in the drawings that are presently preferred, it being understood, however, that the embodiments disclosed and described herein are not limited to the precise arrangements and instrumentalities shown.

DETAILED DESCRIPTION OF THE PREFERRED EMBODIMENTS

Figure 1:
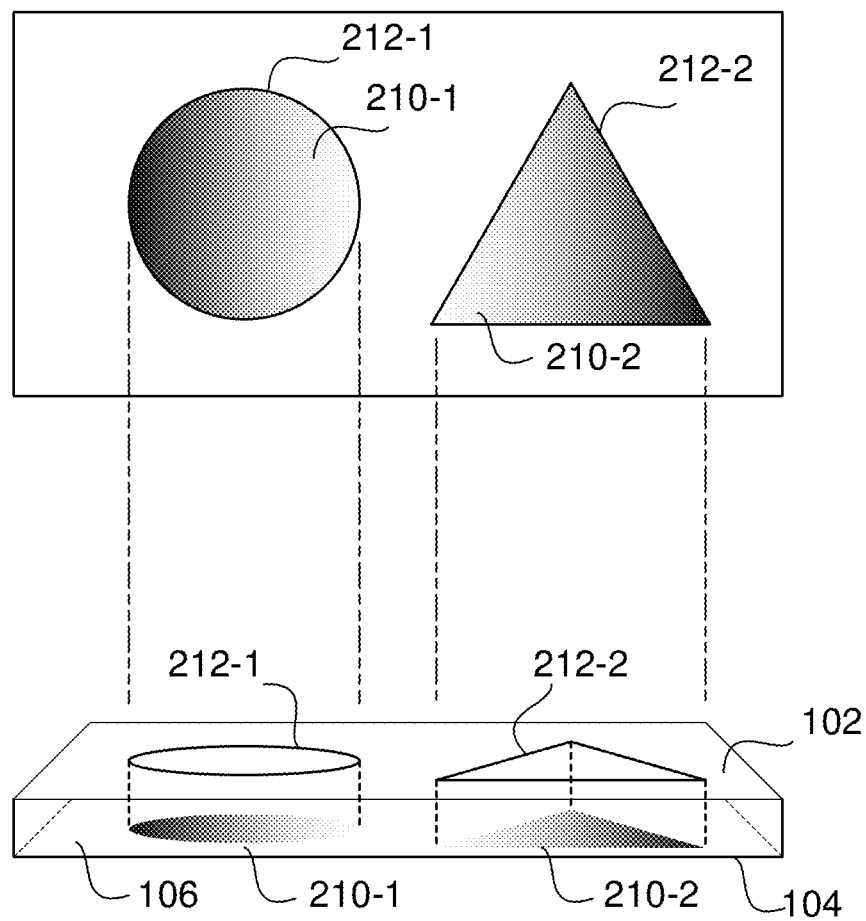
FIG. 1 includes a top view and a perspective view of a substrate having both visual and tactile features.

With reference to the drawings wherein like numerals indicate like elements there is shown in FIG. 1 a substrate 100-1 in accordance with one or more embodiments of this disclosure.

As mentioned above, among the applications of the substrate 100-1 is to provide a visible element of an article, such as a consumer electronic device (e.g., a mobile electronic device, a mobile phone, a smartphone, a tablet, a phablet, a notebook computer, a laptop, etc.) In some embodiments, the substrate 100-1 may also be a structural element of the article, such as forming part of a housing thereof. By way of example, the substrate 100-1 may be formed from glass, glass ceramic material, and/or a polymer material, particularly featuring an at least partially transparent, partially transmissive, and/or at least partially translucent characteristic (e.g., exhibiting greater than about 1%, and preferably greater than about 5%, direct transmission of light). In some embodiments, the substrate 100-1 may be formed from strengthened glass, for example thermally strengthened glass or chemically-strengthened glass, as made with an ion-exchange process for example.

The substrate 100-1 includes a first major surface 102, a second major surface 104 opposite the first major surface, and at least one edge surface 106 extending between the first and second major surfaces 102, 104. By way of example, the article (e.g., a mobile electronics device) that comprises the substrate 100-1 may include a housing within which components of the article are disposed, and wherein the first major surface 102 of the substrate 100-1 forms an outer surface of the housing. Thus, the user of the article may both see and touch the first major surface 102 of the substrate 100-1 when handling the housing of the article.

As previously mentioned, desirable characteristic(s) of the housing of the article include providing improved visual and optionally tactile features via the first major surface 102 of the substrate 100-1. In this regard, the substrate 100-1 includes at least one visual element 210-1, 210-2 disposed on the second major surface 104 of the substrate 100-1 such that the at least one visual element may be viewed through the first major surface 102 thereof. Additionally and/or alternatively, the at least one visual element 210-1, 210-2 may be disposed within the substrate 100-1 using known techniques (e.g., using pigmented glass, etc.). The at least one visual element 210-1, 210-2 may include one or more visual portions arranged into at least one of: (i) one or more areas of color, (ii) one or more lines, (iii) one or more patterns, (iv) one or more designs, (v) one or more images, and (vi) one or more combinations thereof. By way of example, the at least one visual element includes a first visual element 210-1 (e.g., a circle formed via color, lines, patterns, shading, design, etc.), and a second visual element 210-2 (e.g., a triangle formed via color, lines, patterns, shading, design, etc.). Those skilled in the art will appreciate that the particular artistic elements comprised within the at least one visual element 210-1, 210-2 are seemingly infinite, and the illustrated examples are not limiting.

As will be discussed in greater detail later herein, the at least one visual element 210-1, 210-2 may be printed on the second major surface 104 of the substrate 100-1, serving as an inner surface (e.g., an inwardly facing surface of the substrate 100-1 or, in other words, a surface facing an interior of the housing of the article). Thus, the at least one visual element 210-1, 210-2 may be seen by the user through the substrate 100-1 but the at least one visual element 210-1, 210-2 is protected from wear or damage by way of being disposed on the inwardly facing surface (i.e., the second major surface) 104 of the substrate 100-1. As noted above, additional and/or alternative embodiments may include the at least one visual element 210-1, 210-2 disposed within the substrate 100-1.

In addition, the illustrated embodiment includes a combination of the at least one visual element 210-1, 210-2 and at least one tactile element 212-1, 212-2. As will be explained in more detail below, the combination of the at least one visual element 210-1, 210-2 and the at least one tactile element 212-1, 212-2 may be combined in such a way as to enhance both the look and the feel of the article with which the substrate 100-1 is associated. For example, the at least one tactile element 212-1, 212-2 may enhance the feel of the article in the user's hand—but the at least one tactile element 212-1, 212-2 may also operate in such a way that the at least one visual element 210-1, 210-2 is visually enhanced as compared to the at least one visual element 210-1, 210-2 without the at least one tactile element 210-1, 210-2. For example, a notably visually stimulating (depth and/or three-dimensional) effect has been discovered by providing the at least one visual element 210-1, 210-2 on the second major surface 104 of the substrate 100-1 and providing the at least one tactile element 212-1, 212-2 in a complimentary way on the first major surface 102 of the substrate 100-1. In this regard, the complimentary nature of providing the at least one tactile element 212-1, 212-2 may include providing one or more portions of surface roughness and/or small surface elements that complement the color(s), line(s), pattern(s), design(s), and/or image(s), etc. of the at least one visual element 210-1, 210-2.

Skilled artisans will appreciate that the aforementioned complementary provision of the at least one tactile element 212-1, 212-2 may include providing lines, areas, designs, shapes, patterns, etc. of surface roughness and/or small surface elements on the first major surface 102 of the substrate 100-1 that substantially match (e.g., are in registration with) corresponding lines, shapes, patterns, colors, etc. of the at least one visual element 210-1, 210-2. Notably, however, alternative desirable visual effects may be obtained without substantial registration, but rather with some alternative complimentary correspondence of, the lines, areas, designs, shapes, patters, etc. of surface roughness and/or small surface elements on the first major surface 102 of the substrate 100-1 via the at least one tactile element 212-1, 212-2 with the at least one visual element 210-1, 210-2 on the opposite, second major surface 104 thereof.

In this regard, the substrate 100-1 includes the at least one tactile element 212-1, 212-2 disposed on the first major surface 102 thereof. In the illustrated example, the at least one tactile element 212-1, 212-2 includes one or more surface roughness portions and/or small surface elements arranged into at least one of: (i) one or more areas of surface roughness and/or small surface elements, (ii) one or more lines of surface roughness and/or small surface elements, (iii) one or more patterns of surface roughness and/or small surface elements, (iv) one or more designs of surface roughness and/or small surface elements, and (v) one or more combinations thereof. By way of example, the at least one tactile element includes a first tactile element 212-1 (e.g., a circle formed via a line of elevated surface roughness and/or small surface elements, or a line of reduced surface roughness and/or small surface elements), and a second tactile element 212-2 (e.g., a triangle formed via a line of elevated surface roughness and/or small surface elements, or a line of reduced surface roughness and/or small surface elements). Again, those skilled in the art will appreciate that the particular artistic elements comprised within the at least one tactile element 212-1, 212-2 are seemingly without limit.

As will be discussed in greater detail later herein, the at least one tactile element 212-1, 212-2 may be applied to the first major surface 102 of the substrate 100-1 in such a way that such surface serves as an outer surface of the housing on a back side of the article. The first major surface 102 of the substrate 100-1 may be subject to surface processing in order to provide some level of surface roughening (e.g., a hazing effect) that provides some tactile feedback to the user. As will be further developed later herein, the level of surface roughness and/or small surface elements may range from a feeling of sticky smooth (very little or no surface roughness and/or small surface elements), to a feeling of velvety softness (moderate levels of surface roughness, such as a matte surface roughness, and/or moderate levels of small surface elements), to a feeling of substantial roughness (higher levels of roughness and/or small surface elements) in order to achieve design goals.

As can be seen in the illustration of FIG. 1, at least some of the one or more surface roughness portions (and/or small surface element portions) of the at least one tactile element 212-1, 212-2 are positioned on the first major surface 102 of the substrate 100-1 in a complimentary fashion with respect to at least some of the one or more visual portions of the at least one visual element 210-1, 210-2. It has been found that such an arrangement modifies the visual effect of the at least one visual element 210-1, 210-2 as viewed through the first major surface 102 of the substrate 100-1. For example, in some configurations, the complementary arrangement provides a three-dimensional visual effect, particularly at some viewing angles. For example, the first tactile element 212-1 may be shaped and positioned to be in substantial registration with the first visual element 210-1, and the second tactile element 212-2 may be shaped and positioned to be in substantial registration with the second visual element 210-2.

In this example, the substantial registration of the first tactile element 212-1 relative to the first visual element 210-1, may be achieved via a first surface roughness portion (and/or small surface element portion) of the first tactile element 212-1 in the form of a line (e.g., a circular outline)

of complementary size and shape as the circle of the first visual element 210-1. Similarly, the substantial registration of the second tactile element 212-2 relative to the second visual element 210-2, may be achieved via a second surface roughness portion (and/or small surface element portion) of the second tactile element 212-2 in the form of a line (e.g., a triangular outline) of complementary size and shape as the triangle of the second visual element 210-2.

The surface roughness portions (and/or small surface element portions) of the first tactile element 212-1 (in the form of a circle or circular outline) and/or of the second tactile element 212-2 (in the form of a triangle or triangular outline) may be achieved in any number of ways. For example, the surface roughness portions (and/or small surface element portion) may be defined by an area (in this case a circle, a triangle, a circular and/or triangular area) of relatively higher surface roughness (and/or higher surface element height) that is positioned in the visually complimentary fashion with respect to the corresponding visual element 210-1 and/or 210-2 bordered by at least one area of relatively lower surface roughness (and/or lower surface element height). One way of achieving such an effect is to provide: (i) a majority of a total surface area of the first major surface 102 of the substrate 100-1 as a relatively smooth finish of relatively low surface roughness (e.g., ranging from no surface roughness or no surface element height to some low or moderate level of surface roughness, such as a matte finish surface roughness, and/or moderate level of surface element height); and (ii) the area of relatively higher surface roughness, and/or higher surface element height (e.g., the circular and/or triangular outline, circular and/or triangular area) of the tactile element 212-1 and/or 212-2 as a minority of the total surface area of the first major surface 102 and include at least some portions of such circular and/or triangular outline via a surface roughness and/or surface element height that is relatively rougher (e.g., ranging from a moderate level of surface roughness and/or moderate surface element height to a high level of surface roughness and/or high surface element height) as compared with the smooth finish.

Alternatively, the surface roughness portions and/or surface element portions of the first tactile element 212-1 (in the form of a circle or circular outline) and/or of the second tactile element 212-2 (in the form of a tringle or triangular outline) may be achieved via an area of relatively lower surface roughness and/or lower surface element height that is positioned in the visually complimentary fashion bordered by at least one area of relatively higher surface roughness. One way of achieving such an effect is to provide: (i) a majority of a total surface area of the first major surface 102 of the substrate 100-1 as a relatively rough finish (e.g., ranging from some moderate level of surface roughness, such as from rougher than a matte finish surface roughness, and/or some moderate level of surface element height, to some high level of surface roughness and/or some high level of surface element height); and (ii) the area of relatively lower surface roughness and/or relatively lower surface element height (e.g., the circle, the triangle, the circular and/or triangular outline) of the tactile element 212-1 and/or 212-2 as a minority of the total surface area of the first major surface 102 and include at least some portions of such circle, triangle, circular and/or triangular outline, via a surface roughness and/or surface element height that is relatively smoother (e.g., ranging from no surface roughness and/or no surface element height to some low level of surface roughness and/or low level of surface element height) as compared with the rough finish.

Figure 2:
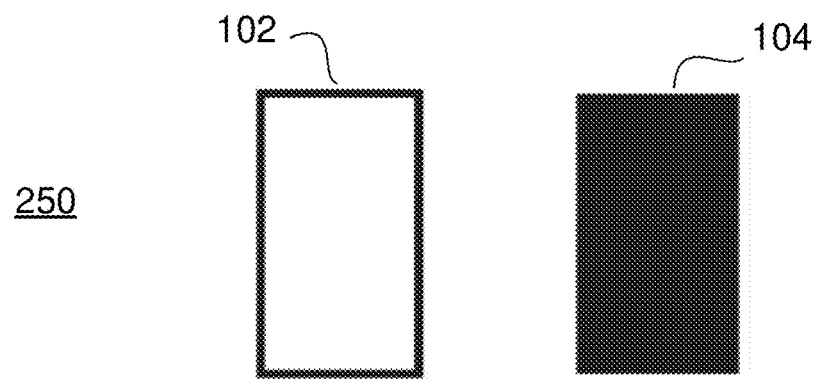
FIGS. 2-3 contain schematic images of a substrate as it moves through a process for disposing the visual and tactile features thereon.
Figure 2:
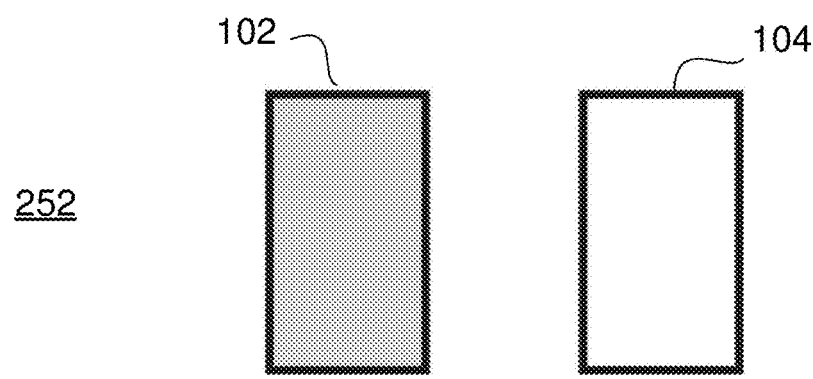
Figure 2:
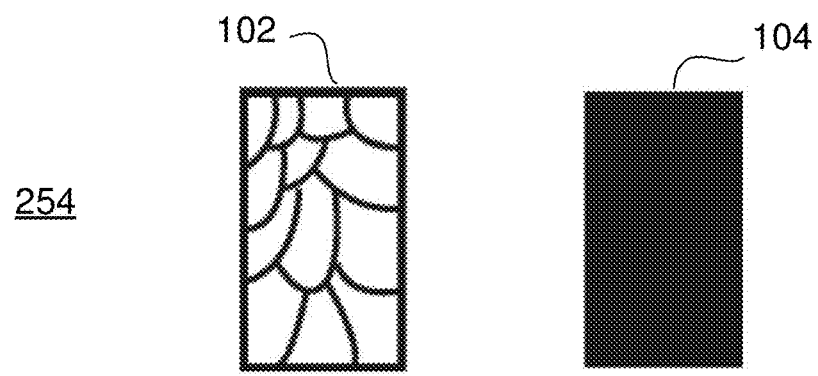
Figure 3:
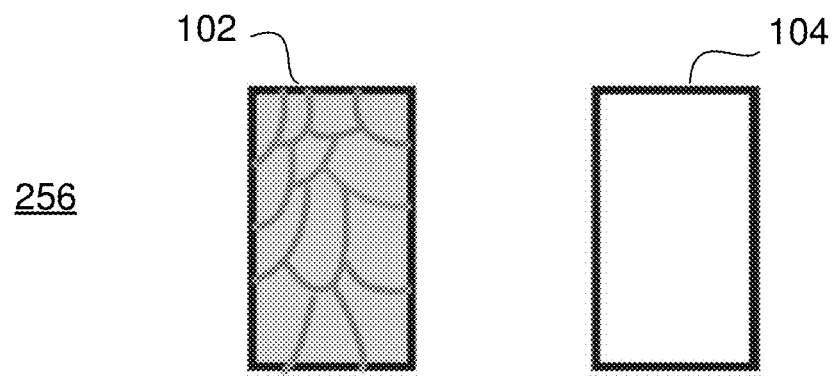
Figure 3:
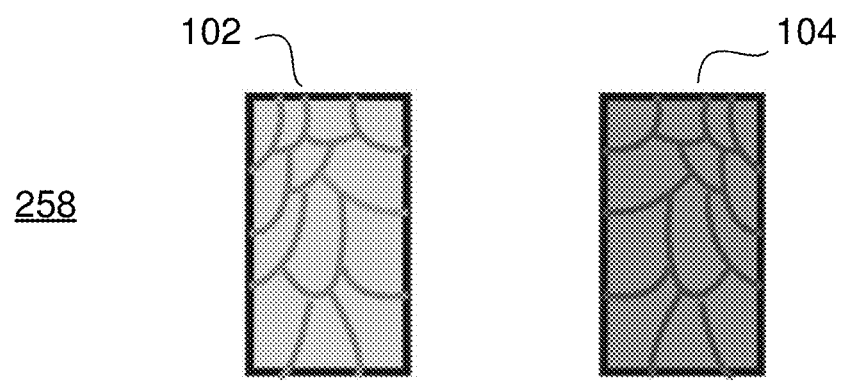
Figure 3:
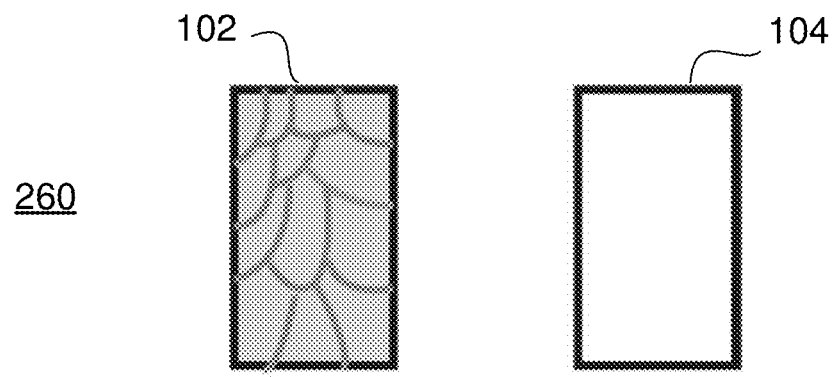

A process for achieving the application of the at least one tactile element 212-1, 212-2 and the at least one visual element 210-1, 210-2 to the substrate 100-1 will be discussed with reference to FIGS. 2-3, which contain schematic images of a substrate 100 as it moves through the process. For purposes of this example, the at least one tactile element 210-1, 210-2 is achieved via surface roughness characteristics. The process disclosed in FIGS. 2-3 is one in which the at least one tactile element 212-1, 212-2 is achieved via a majority of a total surface area of the first major surface 102 of the substrate 100 being relatively smooth and relatively higher surface roughness portions of the at least one tactile element 212-1, 212-2 being disposed in a complementary way with respect to the at least one visual element 210-1, 210-2.

At step 250, substantially all of the second major surface 104 of the substrate 100 is printed with an etch resistive ink (masked, as shown in black at step 250). Next, the substrate 100 is exposed (e.g., dipped, sprayed, etc.) with an acid solution to generate a low to medium level of surface roughness on the first major surface 102, such as a matte finish surface roughness. The resultant matte finish is shown in grey at step 252 in which the etch resistive ink has been removed to expose the relatively smooth finish of the second major surface 104 of the substrate 100 (shown in white at step 252).

At step 254, an etch resistive ink (mask, shown in black in step 254) is applied to the first major surface 102 of the substrate 100. In particular, the etch resistive ink is applied to achieve the aforementioned at least one tactile element 212-1, 212-2 that will eventually be complementary to the at least one visual element 210-1, 210-2, such as: (i) one or more areas, (ii) one or more lines, (iii) one or more patterns (iv) one or more designs, and (v) one or more combinations thereof. Again, substantially all of the second major surface 104 of the substrate 100 is printed with the etch resistive ink (shown in black in step 254). The substrate 100 is again exposed (e.g., dipped, sprayed, etc.) with an acid solution that is designed to polish (reduce the roughness) of the un-masked regions of the first major surface 102 of the substrate 100. The acid solution may also reduce the thickness of the substrate 100 in the un-masked regions via material removal. The resulting matte finish and tactile elements are shown in step 256 in which the etch resistive ink has been removed to expose the previously masked portions of the first major surface 102 and the relatively smooth finish of the second major surface 104 of the substrate 100 (shown in white at step 256). Notably, the previously masked portions of the first major surface 102 will thus be of a higher surface roughness than the un-masked regions of the first major surface 102, which have been polished and somewhat thinned.

Skilled artisans will appreciate that although use of acids for etching and/or polishing were described above as being suitable for use in applying and/or modifying the surface roughness or haze of the substrate 100, any other suitable method may be used, for example sand blasting, embossing, rolling, or mechanical polishing.

In an optional step, the substrate 100 may also be exposed to a strengthening process, for example a thermal strengthening process or a chemical strengthening process (known in the art as an ion exchange process).

At step 258, the at least one visual element 210-1, 210-2 is applied to the second major surface 104 of the substrate 100, as shown in step 258 via the non-white second major surface 104. As previously discussed, this involves applying the at least one visual element 210-1, 210-2 in such a way that it may be viewed through the first major surface 102. This may involve ink printing, ink spraying, coating techniques, photolithography, etc., to provide one or more visual portions arranged into at least one of: (i) one or more areas of color, (ii) one or more lines, (iii) one or more patterns, (iv) one or more designs, (v) one or more images, and (vi) one or more combinations thereof. Also as noted above, the application of the at least one visual element 210-1, 210-2 is done such that at least some of the one or more surface roughness portions of the at least one tactile element 210-1, 210-2 are positioned on the first major surface 102 of the substrate 100 in a complimentary fashion with respect to at least some of the one or more visual portions of the at least one visual element 210-1, 210-2 on the second major surface 104 of the substrate 100.

Skilled artisans will appreciate that although ink printing was described as one manner of forming the etch masks and/or visual elements, any suitable alternative techniques may be employed, for example, printing, screen printing, doctor blading, gravure printing, photolithography, etc.

At step 260, a process for enhancing the visibility of the at least one visual element 210-1, 210-2 through the first major surface 102 of the substrate is carried out. For example, a bright (and preferably neutral) pigment layer, such as white, is applied over the at least one visual element 210-1, 210-2 on the second major surface 104 by way of printing, coating, spraying, etc. The bright layer is shown in step 260 as white. In some embodiments, desirable enhancement of the visibility of the at least one visual element 210-1, 210-2 may be achieved when the "bright" layer is achieved via a shiny black and/or metallic coating applied over the at least one visual element 210-1, 210-2 on the second major surface 104.

Figure 4:
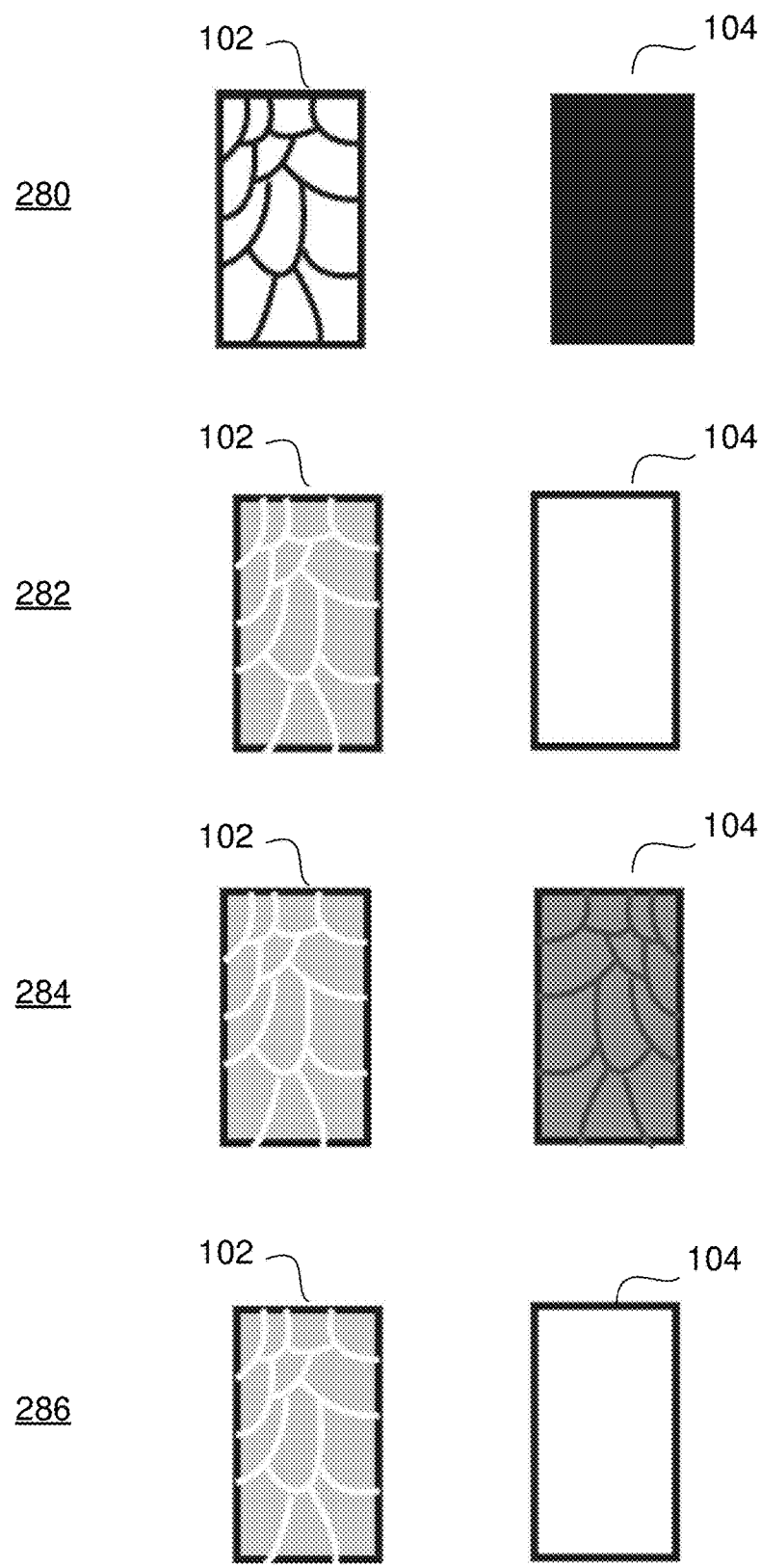
FIG. 4 contains schematic images of a substrate as it moves through an alternative process for disposing the visual and tactile features thereon.

An alternative process for achieving the application of the at least one tactile element 212-1, 212-2 and the at least one visual element 210-1, 210-2 to the substrate 100-1 will be discussed with reference to FIG. 4, which contains schematic images of a substrate 100 as it moves through the alternative process. For purposes of this example, the at least one tactile element 210-1, 210-2 is again achieved via surface roughness characteristics. Notably, the process disclosed in FIG. 4 is one in which the at least one tactile element 212-1, 212-2 is achieved via a majority of a total surface area of the first major surface 102 of the substrate 100 being of a relatively high surface roughness and relatively lower surface roughness portions of the at least one tactile element 212-1, 212-2 being disposed in a complementary way with respect to the at least one visual element 210-1, 210-2.

At step 280, substantially all of the second major surface 104 of the substrate 100 is printed with an etch resistive ink (masked, as shown in black at step 280). In addition, an etch resistive ink (mask, as shown in black at step 280) is applied to the first major surface 102 of the substrate 100. In particular, the etch resistive ink is applied to the first major surface 102 to achieve the aforementioned at least one tactile element 212-1, 212-2 that will eventually be complementary to the at least one visual element 210-1, 210-2, such as: (i) one or more areas, (ii) one or more lines, (iii) one or more patterns (iv) one or more designs, and (v) one or more combinations thereof.

Next, the substrate 100 is exposed (e.g., dipped, sprayed, etc.) with an acid solution to generate a low to medium level of surface roughness on the un-masked portions of the first major surface 102, such as a matte finish surface roughness. Of course, alternative embodiments may employ the acid solution in such a way to produce higher levels of surface roughness. At step 282, the etch resistive ink may then be removed to expose one or more areas, lines, patterns, designs, combinations thereof, etc. that are of a relatively smooth finish (shown in white at step 282) on the first major surface 102 among the other portions that are of a low to medium level of surface roughness (or alternatively even higher levels of roughness, as shown in grey at step 282). In addition, the removal of the etch resistive ink may also expose the relatively smooth finish of the second major surface 104 of the substrate 100 (as shown in white at step 282).

At step 284, the at least one visual element 210-1, 210-2 is applied to the second major surface 104 of the substrate 100 (as shown by non-white surface 104 at step 282). As previously discussed, this involves applying the at least one visual element 210-1, 210-2 in such a way that it may be viewed through the first major surface 102. This may involve ink printing, ink spraying, coating, photolithography, etc., to provide one or more visual portions arranged into at least one of: (i) one or more areas of color, (ii) one or more lines, (iii) one or more patterns, (iv) one or more designs, (v) one or more images, and (vi) one or more combinations thereof. Also as noted above, the application of the at least one visual element 210-1, 210-2 is done such that at least some of the one or more surface roughness portions of the at least one tactile element 210-1, 210-2 are positioned on the first major surface 102 of the substrate 100 in a complimentary fashion with respect to at least some of the one or more visual portions of the at least one visual element 210-1, 210-2 on the second major surface 104 of the substrate 100.

At step 286, a process for enhancing the visibility of the at least one visual element 210-1, 210-2 through the first major surface 102 of the substrate is carried out. For example, a bright (and preferably neutral) pigment layer, such as white, is applied over the at least one visual element 210-1, 210-2 on the second major surface 104 by way of printing, coating, spraying, etc., as shown by white on surface 104 at step 286. As mentioned above, desirable enhancement of the visibility of the at least one visual element 210-1, 210-2 may alternatively be achieved when the "bright" layer is achieved via a shiny black and/or metallic coating applied over the at least one visual element 210-1, 210-2 on the second major surface 104.

The process described above with reference to FIG. 4 results in two different levels of surface roughness in order to achieve the at least one tactile element 212-1, 212-2. Skilled artisans will appreciate, however, that the noted steps in the process may be altered (e.g., by adding steps of masking, etching, polishing, and/or other techniques) in order to achieve three or more different levels of surface roughness, which may enhance the visual and tactile effects at issue.

Skilled artisans will appreciate that the process described above with reference to FIG. 4 may be modified to achieve an alternative set of characteristics for the at least one tactile element 212-1, 212-2. For example, the at least one tactile element 212-1, 212-2 may be formed from at least two differing levels of surface roughness and/or surface element heights, neither of which is the unaltered, original, smooth surface finish of the substrate 100.

In this regard, step 280 may include the aforementioned printing of substantially all of the second major surface 104 of the substrate 100 with the etch resistive ink (masked). However, prior to applying the etch resistive ink to the first major surface 102, the substrate 100 is exposed (e.g., dipped, sprayed, etc.) with an acid solution to generate some level of surface roughness on the first major surface 102, such as a matte finish surface roughness. Thereafter the etch resistive ink (mask) is applied to the first major surface 102 of the substrate 100 (i.e., over the previously formed matte finish) to achieve the aforementioned at least one tactile element 212-1, 212-2 that will eventually be complementary to the at least one visual element 210-1, 210-2.

Next, the substrate 100 is again exposed (e.g., dipped, sprayed, etc.) with an acid solution to generate a further level of surface roughness on the un-masked portions of the first major surface 102, which is rougher than the previously produced matte finish surface roughness. At step 282, the etch resistive ink may then be removed from the first major surface 102 to expose one or more areas, lines, patterns, designs, combinations thereof, etc. that are of the matte finish surface roughness (represented by the lines in white at steps 282, 284 in FIG. 4) among the other portions that are of a higher level of surface roughness (represented by the grey at steps 282, 284 in FIG. 4). In addition, the removal of the etch resistive ink may also expose the relatively smooth finish of the second major surface 104 of the substrate 100 (as shown in white at step 282).

Next, the remainder of the process previously discussed in connection with steps 284 and 286 of FIG. 4 may be carried out, which would produce the at least one tactile element 212-1, 212-2 formed from at least two differing levels of surface roughness, neither of which is the unaltered, original, smooth surface finish of the substrate 100, in a complimentary fashion with respect to the at least one visual element 210-1, 210-2.

Again, the process described above results in two different levels of surface roughness in order to achieve the at least one tactile element 212-1, 212-2. Skilled artisans will appreciate, however, that the noted steps in the process may be altered (e.g., by adding steps of masking, etching, polishing, and/or other techniques) in order to achieve three or more different levels of surface roughness, which may enhance the visual and tactile effects at issue.

Reference is now made to FIGS. 5-8, which include a top view and a series of perspective views of a composite substrate 100-2 having visual features that change with viewing angle. Similarly to that mentioned previously, at least one visual element 220-1, 220-2 may be provided in such a way that certain visual characteristics thereof change depending on a viewing angle of the user.

For example, the at least one visual element 220-1, 220-2 may include at least one first visual element 220-1 and at least one second visual element 220-2, each having at least one different visual characteristic (e.g., different colors, different line patterns, different designs, different images, different combinations thereof, etc.). In the presented example, the at least one first visual element 220-1 is an image of circle with a shaded and/or colored design, and the at least one second visual element 220-2 is an image of circle with a striped pattern design.

The at least one first and second visual elements 220-1, 220-2 may be provided in an integrated fashion on or with the substrate 100-2 in such a way that one of the at least one first and second visual elements 220-1, 220-2 is dominant (more visible) than the other (which is subordinate) when the user views the substrate 100-2 at low viewing angles and the other of the at least one first and second visual elements 220-1, 220-2 is dominant (more visible) than the one when the user views the substrate 100-2 at higher viewing angles. A transitional effect may also be evident, where the user may see a gradual change from dominance to subordinance of the one to the other of the at least one first and second visual elements 220-1, 220-2 as the viewing angle changes from low to high, and vice versa.

The above-noted visual effects will be discussed in more detail later herein. First, however, reference is made to FIG. 9, which is a perspective view of the composite substrate 100-2 of FIGS. 5-8 with respective first and second substrates 110-1, 110-2 thereof in a separated configuration. The first substrate 110-1 has a first major surface 112-1, a second major surface 114-1 opposite the first major surface 112-1, and at least one edge surface 116-1 extending between the first and second major surfaces 112-1 and 114-1. It has been found desirable that the first substrate 110-1 be formed of an at least partially transparent, transmissive and/or translucent material. The second substrate 110-2 has a first major surface 112-2, a second major surface 114-2 opposite the first major surface 112-2, and at least one edge surface 116-2 extending between the first and second major surfaces 112-2, 114-2.

The at least one first visual element 220-1 is disposed on the second major surface 114-1 of the first substrate 110-2. Additionally and/or alternatively, the at least one first visual element 220-1 may be disposed within the first substrate 110-2. Preferably, the at least one first visual element 220-1 is at least partially transparent, transmissive, and/or translucent, and the at least one first visual element 220-1 is viewable through the first major surface 112-1 of the first substrate 110-1 at least at one viewing angle and preferably at a plurality of viewing angles. The at least one second visual element 220-2 is disposed on at least one of the first and second major surfaces 112-2, 114-2 of the second substrate 110-2. Additionally and/or alternatively, the at least one second visual element 220-2 may be disposed within the second substrate 110-2. Preferably, the at least one second visual element 220-2 is substantially less transparent, substantially less translucent, and substantially more opaque than the at least one first visual element 220-1. The at least one second visual element 220-2 is also viewable through the first major surface 112-1 of the first substrate 110-1 at least at one viewing angle and preferably at a plurality of viewing angles.

The first and second substrates 110-1, 110-2 (after and/or during the application of the at least one visual element 222-1, 220-2) are disposed in a stacked fashion to achieve the composite substrate 100-2, for example in contact with one another. Although skilled artisans may apply any suitable technique from achieving the stacked characteristic of the composite substrate 100-2, one example is the employment of a material layer (not shown) between the first and second substrates 110-1, 110-2. In such embodiments, it may be desirable to take thermal expansion coefficients (of the respective materials in the composite structure) into consideration. For example, the thermal expansion coefficients may be matched or un-matched as the particular application dictates. Also, it may be desirable to take index of refractions (of the respective materials in the composite structure) into account. For example, the indices of refraction may be matched or un-matched as the particular application dictates. In some embodiments, the material layer between the first and second substrates 110-1, 110-2 may be air.

Figure 5:
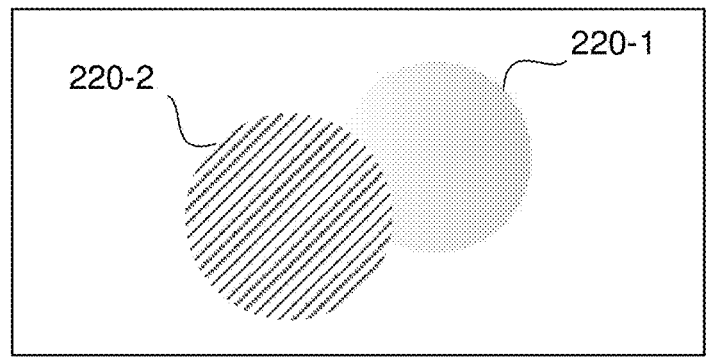
FIGS. 5-8 include a top view and a series of perspective views of a composite substrate having visual features that change with viewing angle.
Figure 6:
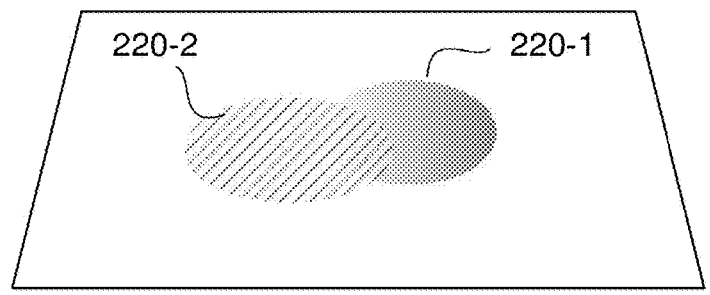
Figure 7:
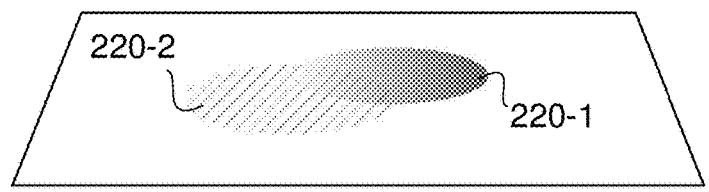
Figure 8:
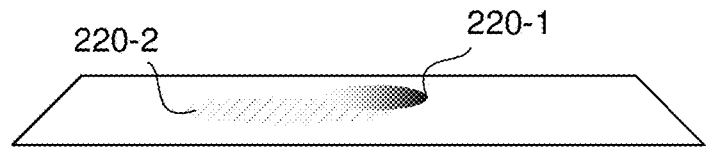
Figure 9:
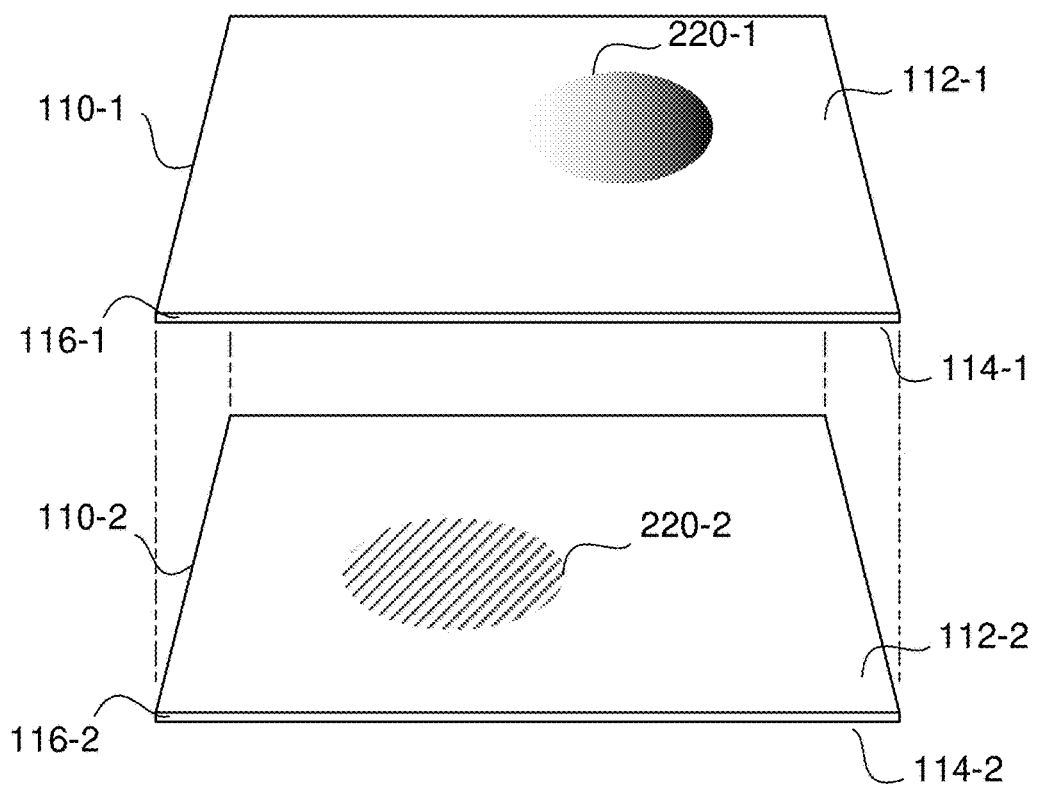
FIG. 9 is a perspective view of the composite substrate of FIGS. 5-8 with respective first and second substrates thereof in a separated configuration.

With reference to FIGS. 5-8, a zero degree viewing angle among the plurality of viewing angles is defined as being normal to the first and second major surfaces 112-1, 112-2, 114-1, 114-2, of the first and second substrates 110-1, 110-2, and relatively high viewing angles among the plurality of viewing angles are defined as being significantly acute to the zero degree viewing angle. By way of example, a significantly acute angle may be greater than about 10 degrees, 20 degrees, 30 degrees, 40 degrees, 50 degrees, 60 degrees, 70 degrees, or 80 degrees. As best seen in FIG. 5, the at least one second visual element 220-2 is dominantly viewable through the first major surface 112-1 of the first substrate 110-1 as compared with the at least one first visual element 220-1 at the zero viewing angle. In contrast, as best seen in FIG. 8, the at least one first visual element 220-1 is dominantly viewable through the first major surface 112-1 of the first substrate 110-1 as compared with the at least one second visual element 220-2 at a relatively highest viewing angle (a significantly acute angle of about 80 degrees).

As can be seen in succession from FIG. 5 through FIG. 8, the at least one second visual element 220-2 becomes gradually less dominantly viewable through the first major surface 112-1 of the first substrate 110-1 as compared with the at least one first visual element 220-1 as the viewing angle increases from zero (FIG. 5) through to the relatively higher viewing angle (FIG. 8). Conversely, the at least one first visual element 220-1 becomes gradually more dominantly viewable through the first major surface 112-1 of the first substrate 110-1 as compared with the at least one second visual element 220-2, as the viewing angle gradually changes from the zero viewing angle to the relatively higher viewing angle (a significantly acute of about 80 degrees, as shown in FIG. 8). At intermediate viewing angles, for example, as shown in FIGS. 6 and 7, the at least one first visual element 220-1 and the at least one second visual element 220-2 are more or less equally visible, presenting a mixed, or combined image.

Skilled artisans will appreciate that the composite substrate 100-2 discussed above may include more than two substrates 110-1, 110-2 in the stack, for example, three substrates, four substrates, or more. Additionally or alternatively, the arrangement may include more than two visual elements 220-1, 220-2, such as three, four, five, or more.

Figure 10:
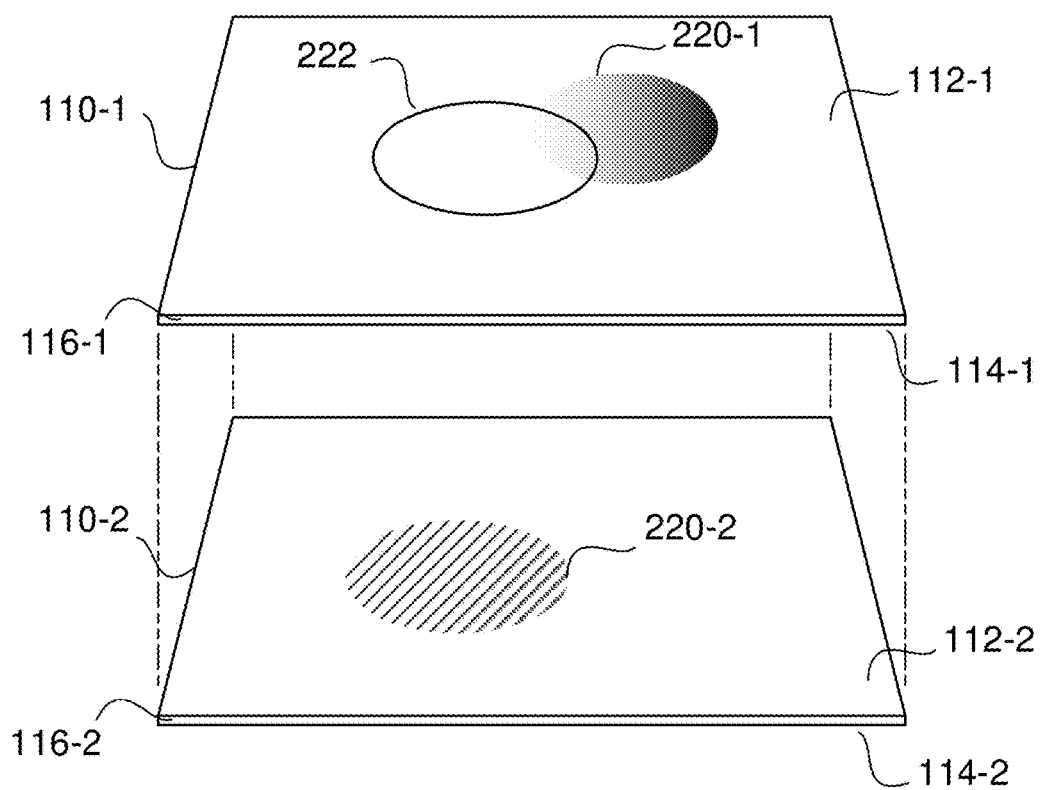
FIG. 10 is a perspective view of an alternative composite substrate with respective first and second substrates thereof in a separated configuration, and including tactile features.

Reference is now made to FIG. 10, which is a perspective view an alternative composite substrate 100-3 with respective first and second substrates 110-1, 110-2 thereof in a separated configuration. In accordance with one or more further embodiments, the above-noted effect of gradual variation from dominance to subordinance between visual elements 222-1, 220-2 as a function of viewing angle may be combined with the above-noted complementary tactile features (e.g., surface roughness and/or surface element height differences) to produce even more visual and tactile effects.

For discussion purposes, the structure of the composite substrate 100-3 is substantially the same as the composite substrate 100-2, except for an additional at least one tactile element 222. The at least one tactile element 222 is disposed on the first major surface 112-1 of the first substrate 110-1. The at least one tactile element 222 may include any number of the aforementioned tactile features discussed above with respect to previous embodiments. In the illustrated case, the at least one tactile element 222 includes one or more lines of surface roughness and/or surface elements (e.g., a circular outline) that is sized, shaped and positioned in a complimentary fashion with respect to the second visual element 220-2.

Figure 14:
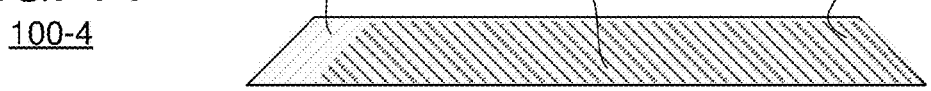
Figure 15:
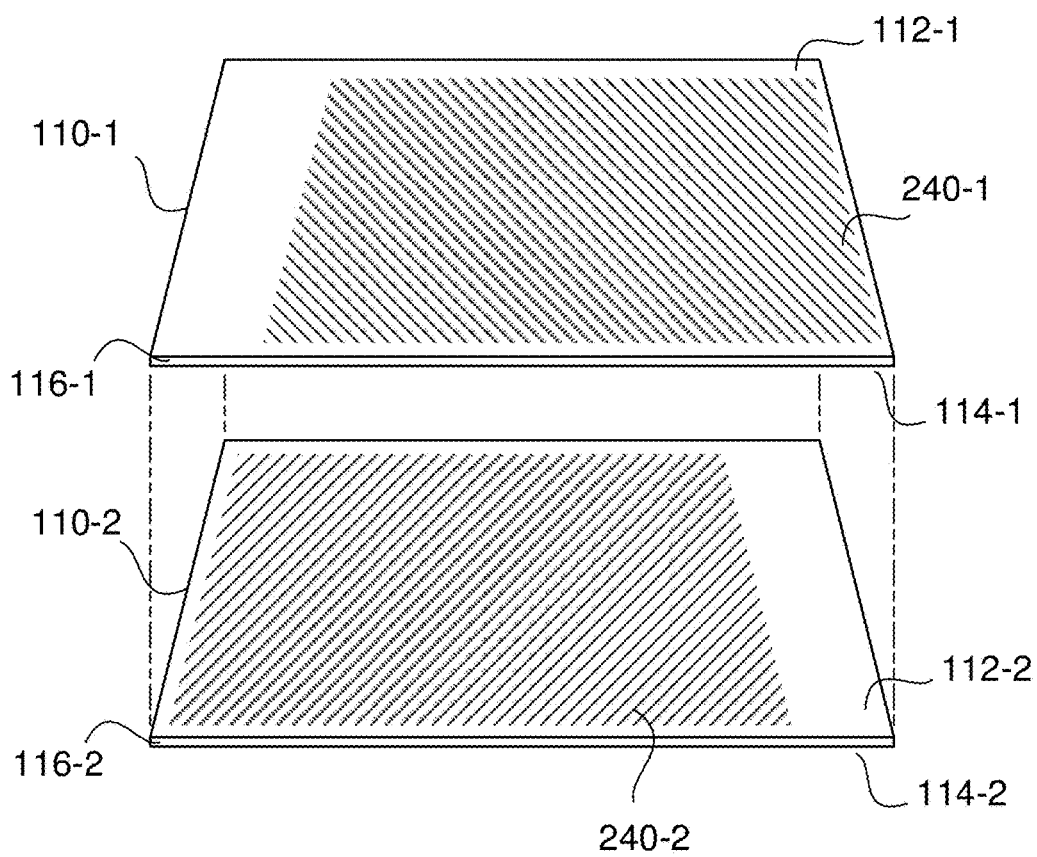
FIG. 15 is a perspective view the composite substrate of FIGS. 11-14 with respective first and second substrates thereof in a separated configuration.

Reference is now made to FIGS. 11-15, where FIGS. 11-14 include a top view, and a series of perspective views of a composite substrate 100-4 having color visual features that change with viewing angle. FIG. 15 is a perspective view the composite substrate 100-4 of FIGS. 11-14 with respective first and second substrates 110-1, 110-2 thereof in a separated configuration. For discussion purposes, the structure of the composite substrate 100-4 is substantially similar to the composite substrate 100-3 except for noted differences. An at least one first visual element 240-1 (a first color, e.g., translucent blue) is disposed on the second major surface 114-1 of the first substrate 110-1. Additionally and/or alternatively, the at least one first visual element 240-1 may be disposed within the first substrate 110-1. An at least one second visual element 240-2 (a second color, e.g., at least somewhat opaque red) is disposed on at least one of the first and second major surfaces 112-2, 114-2 of the second substrate 110-2. Additionally and/or alternatively, the at least one second visual element 240-2 may be disposed within the second substrate 110-2. In the illustrated example, the at least one first visual element 240-1 and the at least one second visual element 240-2 are disposed in registration but slightly offset in a lateral direction for purposes of explanation only. In practice, the visual elements may completely overlap.

Figure 11:
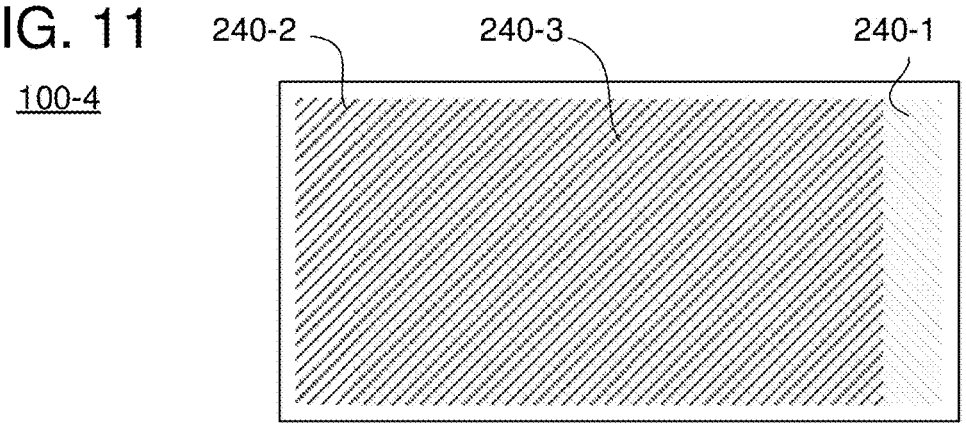
FIGS. 11-14 include a top view and a series of perspective views of a composite substrate having color visual features that change with viewing angle.
Figure 12:
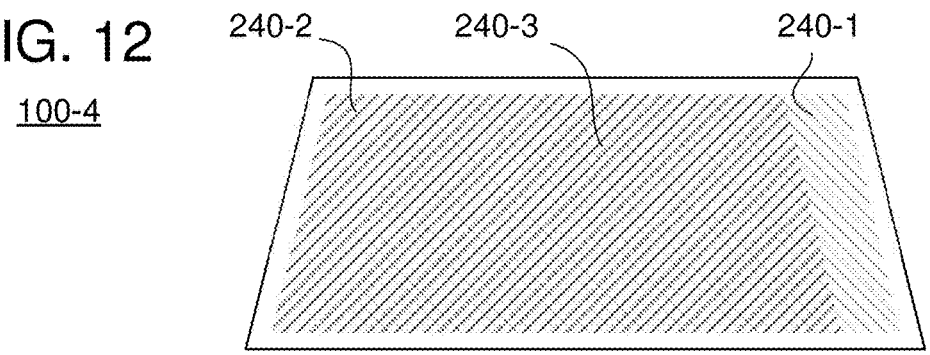
Figure 13:
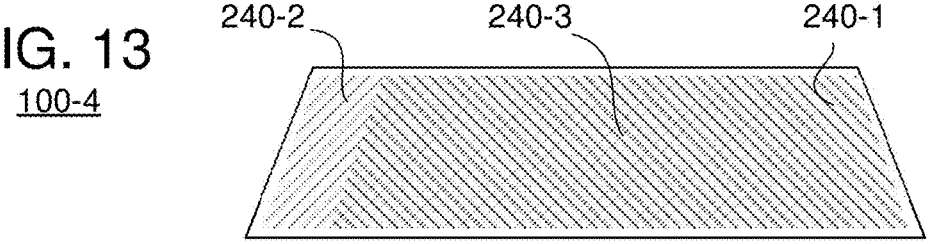

As best seen in FIG. 11, the at least one second visual element 240-2 (for example, a red color) is dominantly viewable through the first major surface 112-1 of the first substrate 110-1 as compared with the at least one first visual element 240-1 (for example, a blue color) at the zero viewing angle. Thus, an extreme left zone of the substrate 100-4 looks dominantly red (240-2), as does a middle zone 240-3. In contrast, an extreme right zone shows no red and only a faint (if any) blue (240-1). In contrast, as best seen in FIG. 14, the at least one first visual element 240-1 (blue) is dominantly viewable through the first major surface 112-1 of the first substrate 110-1 as compared with the at least one second visual element 240-2 (red) at a relatively higher viewing angle. Thus, the extreme right zone of the substrate 100-4 looks dominantly blue (240-1), as does a middle zone 240-3. In contrast, an extreme left zone shows no blue and only a faint (if any) red (240-2).

As can be seen in succession from FIG. 11 through FIG. 14, the at least one second visual element 240-2 (red) becomes gradually less dominantly viewable through the first major surface 112-1 of the first substrate 110-1 as compared with the at least one first visual element 240-1 (blue) as the viewing angle increases from zero (FIG. 11) through to the relatively higher viewing angle (FIG. 14). Conversely, the at least one first visual element 240-1 (blue) becomes gradually more dominantly viewable through the first major surface 112-1 of the first substrate 110-1 as compared with the at least one second visual element 240-2 (red), as the viewing angle gradually changes from the zero viewing angle to the relatively highest viewing angle. Thus, at intermediate viewing angles, shown in FIGS. 12 and 13 for example, the central zone 240-3 appears a varying shades of purple (combined red and blue) as the viewing angle changes.

Skilled artisans will appreciate that the composite substrate 100-4 discussed above may include more than two substrates 110-1, 110-2 in the stack, for example, three substrates, four substrates, or more. Additionally or alternatively, the arrangement may include more than two visual elements 240-1, 240-2, such as three, or four, or more.

Although the disclosure herein has been described with reference to particular embodiments, it is to be understood that these embodiments are merely illustrative of the principles and applications of the embodiments herein. It is therefore to be understood that numerous modifications may be made to the illustrative embodiments and that other arrangements may be devised without departing from the spirit and scope of the present application.

As noted above the one or more tactile elements 212-1, 212-2 on the outer surface of the substrate 100 may be achieved by way of small surface elements exhibiting height difference characteristics in order to provide some tactile feedback to the user. By way of example, the small surface elements may be implemented by changing relative heights of a number of surface portions of the substrate (via material addition or subtraction), which results in: (i) one or more areas of surface height differences, (ii) one or more lines of surface height differences, (iii) one or more patterns of surface height differences, (iv) one or more designs of surface height differences, and (v) one or more combinations thereof. The aforementioned use of material addition in order to achieve the changing relative heights of the surface portions may be implemented by applying a formable material (e.g., a coating, a spray, an at least partially transparent paint, etc.) and curing same. The aforementioned use of material subtraction in order to achieve the changing relative heights of the surface portions may be implemented by removing material of the substrate (e.g., by etching, or the like).

Although composite substrates 100-2, 100-3, 100-4 having two substrates have been shown and described above, any suitable number of substrates may be used. For example, an alternative composite substrate may include 3 or more substrates, 4 or more substrates, 5 or more substrates, 6 or more substrates, 7 or more substrates, 8 or more substrates, 9 or more substrates, 10 or more substrates, etc.

Further, one or more of the substrates may be a photosensitive glass and the visual element may be achieved through photo exposure and/or heat treatments instead of, or in addition to, a printed visual image.

As used herein, a surface having a smooth finish has less roughness and/or haze and/or surface element height than a surface having a matte finish, and a surface having a matte finish has less surface roughness and/or haze and/or surface element height than a rough surface.

Figure 16A:
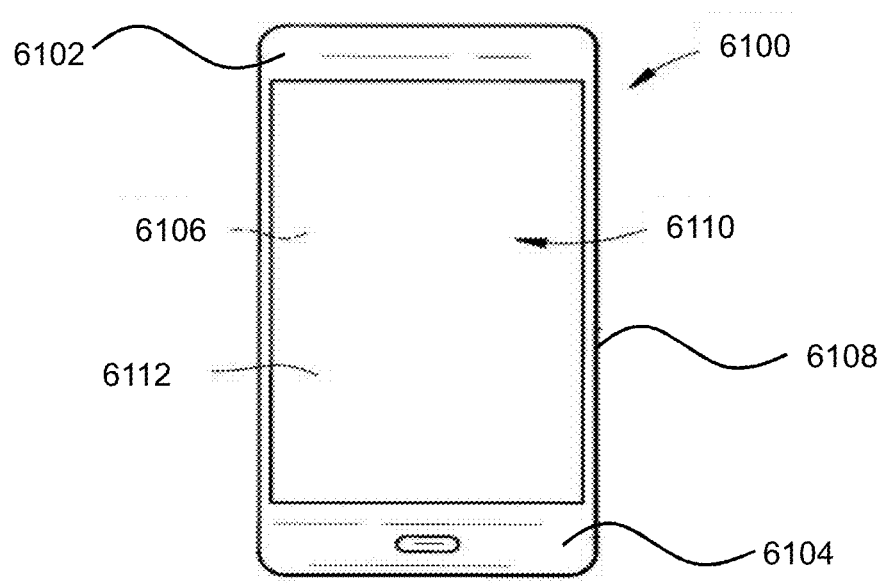
FIG. 16A is a plan view of an exemplary electronic device incorporating any of the strengthened articles disclosed herein.
Figure 16B:
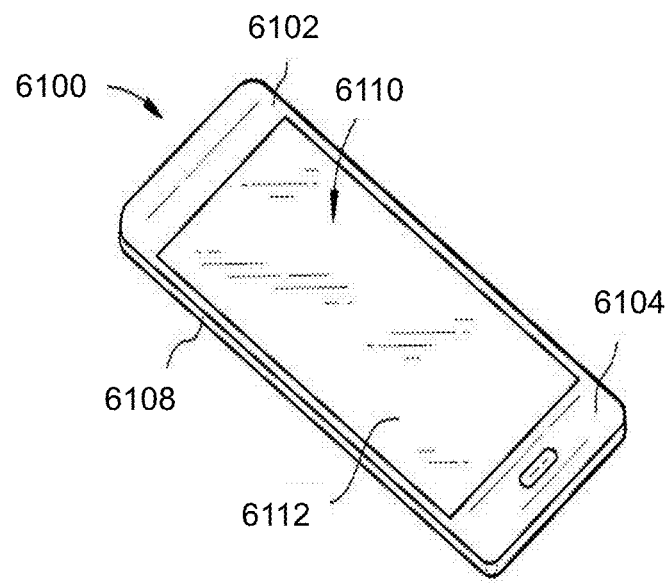
FIG. 16B is a perspective view of the exemplary electronic device of FIG. 16A.

The substrates disclosed herein may be incorporated into another article such as an article with a display (or display articles) (e.g., consumer electronics, including mobile phones, tablets, computers, navigation systems, and the like), architectural articles, transportation articles (e.g., automotive, trains, aircraft, sea craft, etc.), appliance articles, or any article that requires some transparency, scratch-resistance, abrasion resistance or a combination thereof. An exemplary article incorporating any of the substrates disclosed herein is shown in FIGS. 16A and 16B. Specifically, FIGS. 16A and 16B show a consumer electronic device 6100 including a housing 6102 having front 6104, back 6106, and side surfaces 6108; electrical components (not shown) that are at least partially inside or entirely within the housing and including at least a controller, a memory, and a display 6110 at or adjacent to the front surface of the housing; and a cover substrate 6112 at or over the front surface of the housing such that it is over the display. In some embodiments, the cover substrate 6112 may include any of the substrates disclosed herein. In some embodiments, at least one of a portion of the housing or the cover glass comprises the substrates disclosed herein.

Non-limiting examples of embodiments include the following.

Embodiment 1

An apparatus, comprising:
a substrate comprising a first major surface, a second major surface opposite the first major surface, and at least one edge surface extending between the first and second major surfaces, the substrate comprising an at least partially transparent material;
at least one visual element disposed on the second major surface of the substrate and/or within the substrate such that the at least one visual element may be viewed through the first major surface; and
at least one tactile element disposed on the first major surface of the substrate, the at least one tactile element comprising one or more surface roughness portions,
wherein at least some of the one or more surface roughness portions of the tactile element are positioned on the first major surface of the substrate in a complimentary fashion with respect to at least some of the one or more visual portions of the visual element to modify the visual effect of the visual element as viewed through the first major surface of the substrate.

Embodiment 2

The apparatus of embodiment 1, wherein at least some of the one or more surface roughness portions of the tactile element are positioned on the first major surface of the substrate in substantial registration with at least some of the one or more visual portions of the visual element.

Embodiment 3

The apparatus of any one of the preceding embodiments, wherein:
the one or more visual portions of the visual element comprise a first visual portion;
the one or more surface roughness portions of the tactile element comprise a first roughness portion;
the first roughness portion is positioned on the first major surface of the substrate in the visually complimentary fashion with respect to the first visual portion; and
the first roughness portion is defined by one of: (i) an area of relatively higher surface roughness that is positioned in the visually complimentary fashion bordered by at least one area of relatively lower surface roughness, and (ii) an area of relatively lower surface roughness that is positioned in the visually complimentary fashion bordered by at least one area of relatively higher surface roughness.

Embodiment 4

The apparatus of any one of the preceding embodiments, wherein:
a majority of a total surface area of the first major surface of the substrate comprises a first surface roughness;
the one or more surface roughness portions of the tactile element cover a minority of the total surface area of the first major surface and comprise at least some portions that are of a second surface roughness, which is different from the first surface roughness.

Embodiment 5

The apparatus of any one of the preceding embodiments, wherein the second surface roughness is relatively rougher than the first surface roughness.

Embodiment 6

The apparatus of any one of the preceding embodiments, wherein the first surface roughness is relatively rougher than the second surface roughness.

Embodiment 7

The apparatus of any one of the preceding embodiments, wherein the substrate comprises one of glass, glass ceramic material, and polymer material.

Embodiment 8

The apparatus of embodiment 7, wherein the substrate comprises strengthened glass.

Embodiment 9

The apparatus of any one of the preceding embodiments, the at least one visual element comprising one or more visual portions arranged into at least one of: (i) one or more areas of color, (ii) one or more lines, (iii) one or more patterns, (iv) one or more designs, (v) one or more images, and (vi) one or more combinations thereof, and the surface roughness portions arranged into at least one of: (i) one or more areas of surface roughness, (ii) one or more lines of surface roughness, (iii) one or more patterns of surface roughness, (iv) one or more designs of surface roughness, and (v) one or more combinations thereof.

Embodiment 10

A consumer electronic product, comprising:
a housing having a front surface, a back surface and side surfaces;
electrical components provided at least partially within the housing, the electrical components including at least a controller, a memory, and a display, the display being provided at or adjacent the front surface of the housing; and
a cover substrate disposed over the display,
wherein at least one of a portion of the housing or the cover substrate comprises the apparatus of any one of embodiments 1-9.

Embodiment 11

An apparatus, comprising:
a first substrate comprising a first major surface, a second major surface opposite the first major surface, and at least one edge surface extending between the first and second major surfaces, the first substrate comprising an at least partially transparent material;
a second substrate comprising a first major surface, a second major surface opposite the first major surface, and at least one edge surface extending between the first and second major surfaces;
at least one first visual element disposed on the second major surface of the first substrate and/or within the first substrate, the at least one first visual element being translucent, and the at least one first visual element viewable through the first major surface of the first substrate at a plurality of viewing angles; and
at least one second visual element disposed on at least one of the first and second major surfaces of the second substrate and/or within the second substrate, the at least one second visual element being substantially less translucent and substantially more opaque than the at least one first visual element, and the at least one second visual element viewable through the first major surface of the first substrate at the plurality of viewing angles;
wherein the first and second substrates are disposed in a stacked fashion,
wherein a zero degree viewing angle among the plurality of viewing angles is defined as normal to the first and second major surfaces of the first and second substrates, and relatively high viewing angles among the plurality of viewing angles are defined as significantly acute to the zero degree viewing angle; and
wherein the at least one second visual element is dominantly viewable through the first major surface of the first substrate as compared with the at least one first visual element at the zero viewing angle, and the at least one first visual element is dominantly viewable through the first major surface of the first substrate as compared with the at least one second visual element at the relatively high viewing angles.

Embodiment 12

The apparatus of embodiment 11, wherein the at least one second visual element is gradually less dominantly viewable through the first major surface of the first substrate as compared with the at least one first visual element, and the at least one first visual element is gradually more dominantly viewable through the first major surface of the first substrate as compared with the at least one second visual element, as the viewing angle gradually changes from the zero viewing angle to the relatively high viewing angles.

Embodiment 13

The apparatus of embodiment 11 or embodiment 12, wherein at least one of the at least one first visual element and the at least one second visual element comprise one or more visual portions arranged into at least one of: (i) one or more areas of color, (ii) one or more lines, (iii) one or more patterns, (iv) one or more designs, (v) one or more images, and (vi) one or more combinations thereof.

Embodiment 14

The apparatus of any one of embodiments 11-13, further comprising:
at least one tactile element disposed on the first major surface of the first substrate, the at least one tactile element comprising one or more surface roughness portions arranged into at least one of: (i) one or more areas of surface roughness, (ii) one or more lines of surface roughness, (iii) one or more patterns of surface roughness, (iv) one or more designs of surface roughness, and (v) one or more combinations thereof,
wherein at least some of the one or more surface roughness portions of the tactile element are positioned on the first major surface of the first substrate in a complimentary fashion with respect to at least some of the one or more visual portions of at least one of the at least one first visual element and the at least one second visual element to modify the visual effect thereof as viewed through the first major surface of the first substrate.

Embodiment 15

The apparatus of embodiment 14, wherein at least some of the one or more surface roughness portions of the tactile element are positioned on the first major surface of the first substrate in substantial registration with at least some of the one or more visual portions of at least one of the at least one first visual element and the at least one second visual element.

Embodiment 16

The apparatus of embodiment 14 or embodiment 15, wherein:
a majority of a total surface area of the first major surface of the first substrate comprises a first surface roughness;
the one or more surface roughness portions of the tactile element cover a minority of the total surface area of the first major surface of the first substrate and comprise at least some portions that are of a second surface roughness.

Embodiment 17

The apparatus of embodiment 16, wherein the second surface roughness is relatively rougher than the first surface roughness.

Embodiment 18

The apparatus of embodiment 16, wherein the first surface roughness is relatively rougher than the second surface roughness.

Embodiment 19

The apparatus of any one of embodiments 11-18, wherein at least one of:
the first substrate comprises one of glass, glass ceramic material, and polymer material; and
the second substrate comprises one of glass, glass ceramic material, and polymer material.

Embodiment 20

The apparatus of embodiment 19, wherein at least one of the first substrate and the second substrate comprises strengthened glass.

Embodiment 21

A consumer electronic product, comprising:
a housing having a front surface, a back surface and side surfaces;
electrical components provided at least partially within the housing, the electrical components including at least a controller, a memory, and a display, the display being provided at or adjacent the front surface of the housing; and
a cover substrate disposed over the display,
wherein at least one of a portion of the housing or the cover substrate comprises the apparatus of any one of embodiments 11-20.

Embodiment 22

An apparatus, comprising:
a substrate comprising a first major surface, a second major surface opposite the first major surface, and at least one edge surface extending between the first and second major surfaces, the substrate comprising an at least partially transparent material;
at least one visual element disposed on the second major surface of the substrate and/or within the substrate such that the at least one visual element may be viewed through the first major surface; and
at least one tactile element disposed on the first major surface of the substrate, the at least one tactile element comprising one or more surface element portions of differing heights,
wherein at least some of the one or more surface element portions of the tactile element are positioned on the first major surface of the substrate in a complimentary fashion with respect to at least some of the one or more visual portions of the visual element to modify the visual effect of the visual element as viewed through the first major surface of the substrate.

Embodiment 23

The apparatus of embodiment 22, wherein at least some of the one or more surface element portions of the tactile element are positioned on the first major surface of the substrate in substantial registration with at least some of the one or more visual portions of the visual element.

Embodiment 24

The apparatus of embodiment 22 or embodiment 23, wherein:
the one or more visual portions of the visual element comprise a first visual portion;
the one or more surface element portions of the tactile element comprise a first surface element portion;
the first surface element portion is positioned on the first major surface of the substrate in the visually complimentary fashion with respect to the first visual portion; and
the first surface element portion is defined by one of: (i) an area of relatively higher surface height that is positioned in the visually complimentary fashion bordered by at least one area of relatively lower surface height, and (ii) an area of relatively lower surface height that is positioned in the visually complimentary fashion bordered by at least one area of relatively higher surface height.

Embodiment 25

The apparatus of any one of embodiments 22-24, wherein:
a majority of a total surface area of the first major surface of the substrate comprises a first surface height;
the one or more surface element portions of the tactile element cover a minority of the total surface area of the first major surface and comprise at least some portions that are of a second surface height, which is different from the first surface height.

Embodiment 26

The apparatus of any one of embodiments 22-25, wherein the second surface height is relatively higher than the first surface height.

Embodiment 27

The apparatus of any one of embodiments 22-26, wherein the first surface height is relatively higher than the second surface height.

Embodiment 28

The apparatus of any one of embodiments 22-27, wherein the substrate comprises one of glass, glass ceramic material, and polymer material.

Embodiment 29

The apparatus of any one of embodiments 22-28, wherein the substrate comprises strengthened glass.

Embodiment 30

The apparatus of any one of embodiments 22-29, the at least one visual element comprising one or more visual portions arranged into at least one of: (i) one or more areas of color, (ii) one or more lines, (iii) one or more patterns, (iv) one or more designs, (v) one or more images, and (vi) one or more combinations thereof, and the one or more surface element portions of differing heights arranged into at least one of: (i) one or more areas of surface height differences, (ii) one or more lines of surface height differences, (iii) one or more patterns of surface height differences, (iv) one or more designs of surface height differences, and (v) one or more combinations thereof.

Embodiment 31

A consumer electronic product, comprising:
a housing having a front surface, a back surface and side surfaces;
electrical components provided at least partially within the housing, the electrical components including at least a controller, a memory, and a display, the display being provided at or adjacent the front surface of the housing; and
a cover substrate disposed over the display,
wherein at least one of a portion of the housing or the cover substrate comprises the apparatus of any one of embodiments 22-30.

Embodiment 32

A method, comprising:
applying at least one tactile element on a first major surface of a substrate, the substrate further comprising a second major surface opposite the first major surface, and at least one edge surface extending between the first and second major surfaces, the substrate comprising an at least partially transparent material, the at least one tactile element comprising one or more surface roughness portions arranged into at least one of: (i) one or more areas of surface roughness, (ii) one or more lines of surface roughness, (iii) one or more patterns of surface roughness, (iv) one or more designs of surface roughness, and (v) one or more combinations thereof;
applying at least one visual element on the second major surface of the substrate and/or within the substrate such that the at least one visual element may be viewed through the first major surface, the at least one visual element comprising one or more visual portions arranged into at least one of: (i) one or more areas of color, (ii) one or more lines, (iii) one or more patterns, (iv) one or more designs, (v) one or more images, and (vi) one or more combinations thereof; and
positioning at least some of the one or more surface roughness portions of the tactile element on the first major surface of the substrate in a complimentary fashion with respect to at least some of the one or more visual portions of the visual element to modify the visual effect of the visual element as viewed through the first major surface of the substrate.

The invention claimed is:

1. An apparatus, comprising:
a substrate comprising a first major surface, a second major surface opposite the first major surface, and at least one edge surface extending between the first and second major surfaces, the substrate comprising an at least partially transparent material;
at least one visual element disposed on the second major surface of the substrate and/or within the substrate such that the at least one visual element may be viewed through the first major surface; and
at least one tactile element disposed on the first major surface of the substrate, the at least one tactile element comprising one or more surface roughness portions,
wherein at least some of the one or more surface roughness portions of the tactile element are positioned on the first major surface of the substrate in a complimentary fashion with respect to at least some of the one or more visual portions of the visual element to modify the visual effect of the visual element as viewed through the first major surface of the substrate.

2. The apparatus of claim 1, wherein at least some of the one or more surface roughness portions of the tactile element are positioned on the first major surface of the substrate in substantial registration with at least some of the one or more visual portions of the visual element.

3. The apparatus of claim 1, wherein:
the one or more visual portions of the visual element comprise a first visual portion;
the one or more surface roughness portions of the tactile element comprise a first roughness portion;
the first roughness portion is positioned on the first major surface of the substrate in the visually complimentary fashion with respect to the first visual portion; and
the first roughness portion is defined by one of: (i) an area of relatively higher surface roughness that is positioned in the visually complimentary fashion bordered by at least one area of relatively lower surface roughness, and (ii) an area of relatively lower surface roughness that is positioned in the visually complimentary fashion bordered by at least one area of relatively higher surface roughness.

4. The apparatus of claim 1, wherein:
a majority of a total surface area of the first major surface of the substrate comprises a first surface roughness;
the one or more surface roughness portions of the tactile element cover a minority of the total surface area of the first major surface and comprise at least some portions that are of a second surface roughness, which is different from the first surface roughness.

5. The apparatus of claim 1, wherein the second surface roughness is relatively rougher than the first surface roughness.

6. The apparatus of claim 1, wherein the first surface roughness is relatively rougher than the second surface roughness.

7. The apparatus of claim 1, wherein the substrate comprises one of glass, glass ceramic material, and polymer material.

8. The apparatus of claim 7, wherein the substrate comprises strengthened glass.

9. The apparatus of claim 1, the at least one visual element comprising one or more visual portions arranged into at least one of: (i) one or more areas of color, (ii) one or more lines, (iii) one or more patterns, (iv) one or more designs, (v) one or more images, and (vi) one or more combinations thereof, and the surface roughness portions arranged into at least one of: (i) one or more areas of surface roughness, (ii) one or more lines of surface roughness, (iii) one or more patterns of surface roughness, (iv) one or more designs of surface roughness, and (v) one or more combinations thereof.

10. A consumer electronic product, comprising:
a housing having a front surface, a back surface and side surfaces;
electrical components provided at least partially within the housing, the electrical components including at least a controller, a memory, and a display, the display being provided at or adjacent the front surface of the housing; and
a cover substrate disposed over the display,
wherein at least one of a portion of the housing or the cover substrate comprises the apparatus of claim 1.

11. An apparatus, comprising:
a substrate comprising a first major surface, a second major surface opposite the first major surface, and at least one edge surface extending between the first and second major surfaces, the substrate comprising an at least partially transparent material;
at least one visual element disposed on the second major surface of the substrate and/or within the substrate such that the at least one visual element may be viewed through the first major surface; and
at least one tactile element disposed on the first major surface of the substrate, the at least one tactile element comprising one or more surface element portions of differing heights,
wherein at least some of the one or more surface element portions of the tactile element are positioned on the first major surface of the substrate in a complimentary fashion with respect to at least some of the one or more visual portions of the visual element to modify the visual effect of the visual element as viewed through the first major surface of the substrate.

12. The apparatus of claim 11, wherein at least some of the one or more surface element portions of the tactile element are positioned on the first major surface of the substrate in substantial registration with at least some of the one or more visual portions of the visual element.

13. The apparatus of claim 11, wherein:
the one or more visual portions of the visual element comprise a first visual portion;
the one or more surface element portions of the tactile element comprise a first surface element portion;
the first surface element portion is positioned on the first major surface of the substrate in the visually complimentary fashion with respect to the first visual portion; and
the first surface element portion is defined by one of: (i) an area of relatively higher surface height that is positioned in the visually complimentary fashion bordered by at least one area of relatively lower surface height, and (ii) an area of relatively lower surface height that is positioned in the visually complimentary fashion bordered by at least one area of relatively higher surface height.

14. The apparatus of claim 11, wherein:
a majority of a total surface area of the first major surface of the substrate comprises a first surface height;
the one or more surface element portions of the tactile element cover a minority of the total surface area of the first major surface and comprise at least some portions that are of a second surface height, which is different from the first surface height.

15. The apparatus of claim 11, wherein the second surface height is relatively higher than the first surface height.

16. The apparatus of claim 11, wherein the first surface height is relatively higher than the second surface height.

17. The apparatus of claim 11, wherein the substrate comprises one of glass, glass ceramic material, and polymer material.

18. The apparatus of claim 11, wherein the substrate comprises strengthened glass.

19. The apparatus of claim 11, the at least one visual element comprising one or more visual portions arranged into at least one of: (i) one or more areas of color, (ii) one or more lines, (iii) one or more patterns, (iv) one or more designs, (v) one or more images, and (vi) one or more combinations thereof, and the one or more surface element portions of differing heights arranged into at least one of: (i) one or more areas of surface height differences, (ii) one or more lines of surface height differences, (iii) one or more patterns of surface height differences, (iv) one or more designs of surface height differences, and (v) one or more combinations thereof.

20. A consumer electronic product, comprising:
a housing having a front surface, a back surface and side surfaces;
electrical components provided at least partially within the housing, the electrical components including at least a controller, a memory, and a display, the display being provided at or adjacent the front surface of the housing; and
a cover substrate disposed over the display,
wherein at least one of a portion of the housing or the cover substrate comprises the apparatus of claim 11.

21. A method, comprising:
applying at least one tactile element on a first major surface of a substrate, the substrate further comprising a second major surface opposite the first major surface, and at least one edge surface extending between the first and second major surfaces, the substrate comprising an at least partially transparent material, the at least one tactile element comprising one or more surface roughness portions arranged into at least one of: (i) one or more areas of surface roughness, (ii) one or more lines of surface roughness, (iii) one or more patterns of surface roughness, (iv) one or more designs of surface roughness, and (v) one or more combinations thereof;
applying at least one visual element on the second major surface of the substrate and/or within the substrate such that the at least one visual element may be viewed through the first major surface, the at least one visual element comprising one or more visual portions arranged into at least one of: (i) one or more areas of color, (ii) one or more lines, (iii) one or more patterns, (iv) one or more designs, (v) one or more images, and (vi) one or more combinations thereof; and
positioning at least some of the one or more surface roughness portions of the tactile element on the first major surface of the substrate in a complimentary fashion with respect to at least some of the one or more visual portions of the visual element to modify the visual effect of the visual element as viewed through the first major surface of the substrate.

* * * * *